(12) United States Patent
Tyagi

(10) Patent No.: US 11,742,799 B2
(45) Date of Patent: Aug. 29, 2023

(54) VOLTAGE CONTROLLED OSCILLATOR WITH HIGH Q FACTOR TUNING BANKS

(71) Applicant: STMicroelectronics International N.V., Geneva (CH)

(72) Inventor: Kapil Kumar Tyagi, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/750,137

(22) Filed: May 20, 2022

(65) Prior Publication Data

US 2022/0385234 A1  Dec. 1, 2022

Related U.S. Application Data

(60) Provisional application No. 63/193,979, filed on May 27, 2021.

(51) Int. Cl.
*H03B 5/12* (2006.01)
*H03L 5/00* (2006.01)
*H03K 3/03* (2006.01)

(52) U.S. Cl.
CPC ............ *H03B 5/1265* (2013.01); *H03L 5/00* (2013.01); *H03B 2200/003* (2013.01); *H03K 3/0315* (2013.01)

(58) Field of Classification Search
CPC ... H03B 5/1265; H03B 2200/003; H03L 5/00; H03K 3/0315

USPC .......................... 327/180; 331/175, 182, 167
See application file for complete search history.

(56) References Cited

U.S. PATENT DOCUMENTS

| | | | |
|---|---|---|---|
| 7,256,660 B2 | 8/2007 | Gelhausen et al. | |
| 7,271,673 B2 | 9/2007 | Song | |
| 7,532,001 B2 | 5/2009 | Lee et al. | |
| 8,044,739 B2 | 10/2011 | Rangarajan et al. | |
| 8,044,741 B2 | 10/2011 | Barton et al. | |
| 8,400,226 B2 | 3/2013 | Chen et al. | |
| 2002/0070815 A1* | 6/2002 | Traub ...................... | H03J 5/244 331/117 R |
| 2007/0247237 A1 | 10/2007 | Mohammadi | |

OTHER PUBLICATIONS

Sjöland, "Improved Switched Tuning of Differential CMOS VCOs," *IEEE Transactions on Circuits and Systems-II: Analog and Digital Signal Processing*, 49(5): 352-355, May 2002.

* cited by examiner

*Primary Examiner* — Arnold M Kinkead
(74) *Attorney, Agent, or Firm* — Seed IP Law Group LLP

(57) ABSTRACT

A voltage controlled oscillator (VCO) has a VCO core and a tuning bank. The tuning bank includes first and second tuning capacitors. A main switch is coupled between the first and second tuning capacitors. The tuning bank also includes control switches that receive a control signal to selectively activate the tuning bank. The main switch receives a level-shifted control signal to activate the tuning bank.

16 Claims, 3 Drawing Sheets

VOLTAGE CONTROLLED OSCILLATOR WITH HIGH Q FACTOR TUNING BANKS

BACKGROUND

Technical Field

The present disclosure is related to integrated circuits, and more particularly to oscillators within integrated circuits.

Description of the Related Art

Integrated circuits include many types of circuit blocks. The circuit blocks can include memory arrays, memory control circuits, digital logic blocks, analog-to-digital converters, digital-to-analog converters, and many other types of circuit blocks.

In many cases, clock signals are utilized to control the function of the various circuit blocks. A clock signal typically corresponds to a square wave with a selected frequency and a corresponding period. The transitions between the high and low states of the clock signal control various aspects of the circuit blocks.

Clock signals can be generated in a variety of ways. For example, a clock signal can be generated by a crystal oscillator. Crystal oscillators may utilize the mechanical resonance of a vibrating crystal of piezoelectric material to create an oscillating signal with a constant frequency. The clock signal can be generated based on the oscillating signal. One drawback of a crystal oscillator is that a crystal oscillator is positioned on a circuit board external to the integrated circuit. This can be highly inconvenient.

A voltage controlled oscillator (VCO) can be utilized to generate a clock signal. The VCO has various benefits including that the VCO is formed as part of the integrated circuit and that it is possible to trim or adjust the frequency of an oscillating signal of the VCO by varying the voltage applied to the VCO. However, VCO's suffer from some drawbacks, including that it is not always practical to adjust the frequency of the oscillating signal by simply adjusting a voltage applied to the VCO.

BRIEF SUMMARY

Embodiments of the present disclosure provide a VCO that includes a plurality of tuning banks that can be selectively activated to adjust a frequency of an oscillating signal output by the VCO. Each tuning bank includes a pair of tuning capacitors coupled together by a main switch. Each tuning bank includes a level shifter that provides a level shifted control signal to the main switch. The level shifted control signal helps to maintain a very high Q-factor of the tuning bank.

In some embodiments, an integrated circuit includes a VCO. The VCO includes a VCO core having a first output and a second output, a first capacitor coupled to the first output, and a second capacitor coupled to the second output. The VCO includes a main transistor coupled between the first capacitor and the second capacitor. The VCO includes a level shifter coupled to a gate terminal of the first transistor.

In some embodiments, a method includes generating an oscillating signal with a VCO core, receiving, with a level shifter, a first control signal, and generating, with the level shifter, a second control signal by level-shifting the first control signal. The method includes adjusting a frequency of the oscillating signal by selectively applying the second control signal to a gate terminal of a transistor coupled to a tuning capacitor external to the VCO core.

In some embodiments, an integrated circuit includes a VCO core, a first tuning capacitor having a first terminal coupled to a first output of the VCO core, and a main transistor having a first conduction terminal coupled to the first terminal of the first tuning capacitor. The VCO includes a level shifter coupled to a gate terminal of the main transistor.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known algorithms associated with facial recognition, facial detection, and facial authentication have not been shown or described in detail, to avoid unnecessarily obscuring descriptions of the embodiments. Further, well-known components and circuits associated with memory arrays have not been shown or described in detail, to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

Figure 1:
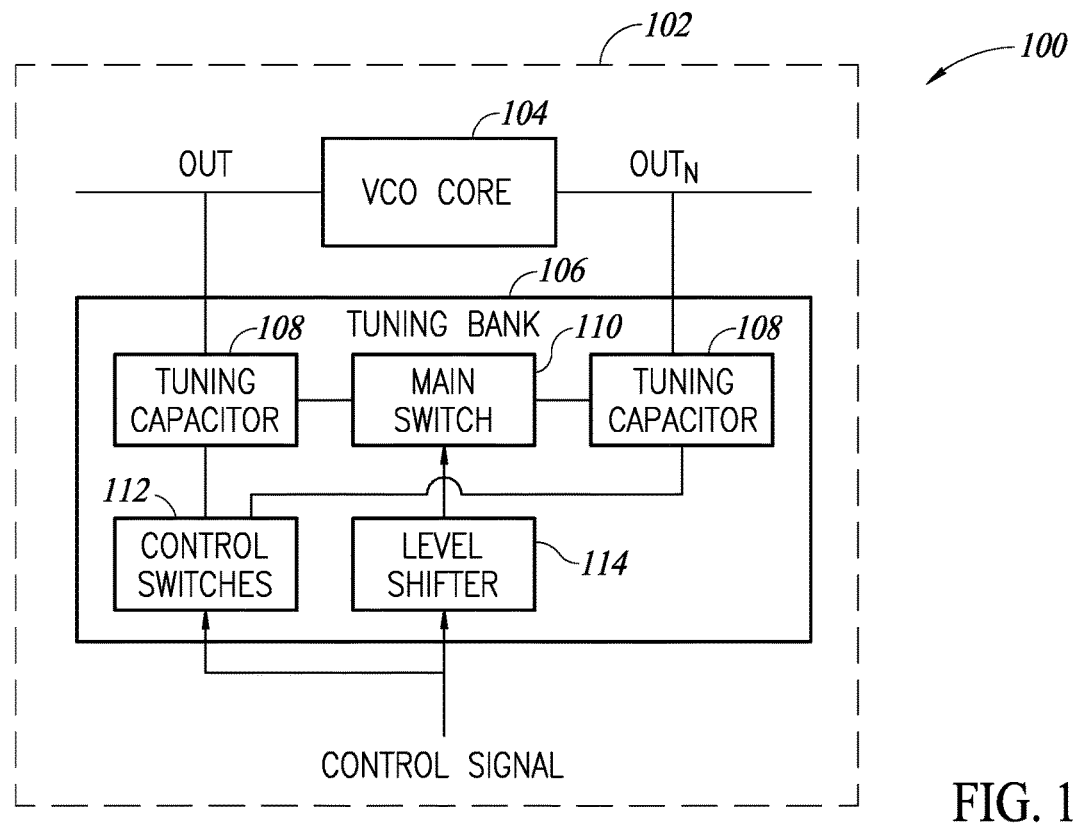
FIG. 1 is a block diagram of an integrated circuit, in accordance with some embodiments.

FIG. 1 is a block diagram of an integrated circuit 100, in accordance with some embodiments. The integrated circuit 100 includes a VCO 102. The VCO 102 includes a VCO core 104 and a tuning bank 106. As will be set forth in more detail below, VCO core 104 and the tuning bank 106 cooperate to provide an oscillating signal that can be tuned or adjusted while maintaining a high Q-factor.

The VCO core 104 includes a first output OUT and a second output OUTn. The VCO core 104 generates an oscillating signal. The VCO core 104 outputs the oscillating signal on the output OUT. The VCO core 104 also generates a complementary oscillating signal. The VCO core outputs the complementary oscillating signal on the output OUTn. The complimentary output OUTn is 180 degrees out of phase with the output OUT. In some cases, the complementary oscillating signal may be considered as the logical complement of the oscillating signal provided at OUT. For example, if the oscillating signal is a square wave that transitions between high and low logic values, then the complementary oscillating signal is a square wave that is at the high logic value when the oscillating signal is at the low logic value, and that is at the low logic value, when the oscillating signal is at the high logic value. However, in practice, OUT and OUTn can be sinusoidal in nature with very small amplitudes and a constant phase difference of 180 degrees.

In some embodiments, the VCO core 104 may include an inductor-capacitor (LC) tank circuit. The VCO core 104 outputs an oscillating signal OUT having a frequency $f_0$. In the example of a ring oscillator, the VCO core 104 may include a plurality of inverters coupled together in series. The output of each inverter is coupled to the input of the next inverter. The output of the final inverter is coupled to the input of the first inverter. The VOC core 104 may alternatively include a ring oscillator or another type of oscillator.

The VCO core 104 may include an odd number of series connected inverters. The output of the final inverter is also the oscillating signal OUT. Because there are an odd number of inverters, and the first inverter receives as its input the output of the final inverter, an oscillating signal is generated at the output of the inverter final inverter.

In an illustrative nonlimiting example, the VCO core 104 includes three series connected inverters that collectively generate the oscillating signal. When the input of the first inverter transitions high, the output of the first inverter will transition low. Because the output of the first inverter is coupled to the input of the second inverter, when the output of the first inverter transitions low, the output of the second inverter will transition high. Because the output of the second inverter is the input of the third inverter, when the output of the second inverter transitions high, the output of the third inverter will transition low. Because the output of the third inverter is fed back to the input of the first inverter, the input of the first inverter will transition from a previously high state to the low state of the output of the third inverter. When the input of the first inverter is low, the output of the third inverter will transition high. Thus, an oscillating signal is generated at the output of the third inverter. In practice, a ring oscillator may include different numbers of inverters and various additional circuit components without departing from the scope of the present disclosure.

Continuing with the example of a ring oscillator having three inverters, each of the transitions from high to low or low to high at the outputs of the inverters takes a finite amount of time. The period of the oscillator signal is the product of the number of inverters in the VCO core 104 multiplied by the time required for an inverter to make a single transition from a low to a high or a high to a low state multiplied by 2 because the period will include both a half cycle on the low state and a half cycle on the high state, the high and the low state together forming one cycle. For example, if the transition time for one of the inverters of the VCO core 104 is 0.1 ns, then the total period of the oscillating signal is 0.6 ns. If the period of the oscillating signal is 0.6 ns, then the frequency of the oscillator signal, which is the inverse of the period of the oscillator signal, is about 1.67 GHz. Other frequencies and periods can be utilized without departing from the scope of the present disclosure.

The period of transition between high and low states corresponds to the time it takes for the inherent capacitors (gate-body, gate-source, gate-drain) of a transistor of the inverter to charge or discharge. Accordingly, the frequency and period of the oscillating signal is based, in part, on the capacitances associated with circuit components associated with generation of the oscillating signal. Though an example has been utilized in which the VCO core 104 includes a ring oscillator, the VCO core 104 can utilize other types of oscillators without departing from the scope of the present disclosure.

For various reasons, it may be desirable to adjust the frequency of the oscillating signal at the output OUT. For example, the oscillating signal output by the VCO core 104 may have slightly different value than expected based on variations in semiconductor processes utilized to fabricate the integrated circuit 100. Additionally, the frequency of the oscillating signal may vary based on the temperature of the integrated circuit 100. For these reasons, the integrated circuit 100 includes a tuning bank 106 that can be selectively activated to adjust a frequency of the oscillating signal at the output OUT.

The tuning bank 106 includes a first tuning capacitor 108 and a second tuning capacitor 109. The first tuning capacitor 108 is coupled to the output OUT. The second tuning capacitor 109 is coupled to the complementary output OUTn. As set forth previously, higher capacitances associated with the VCO core 104 typically result in lower frequencies of the oscillating signal. Accordingly, the capacitances of the tuning capacitors 108 and 109 can be selectively added to the output terminals OUT and OUTn in order to adjust the frequency of the oscillating signal and the complementary oscillating signal.

The tuning bank 106 receives a control signal. The control signal determines whether or not the capacitances of the tuning capacitors 108 and 109 will be added to the outputs OUT and OUTn. In one example, if the control signal is high, then the tuning bank 106 will be activated and the capacitances of the tuning capacitors 108 and 109 will be added to the outputs OUT and OUTn. If the control signal is low, then the tuning bank 106 will not be activated and the capacitances of the tuning capacitors 108 and 109 will not be added to the outputs OUT and OUTn.

The tuning bank 106 includes a main switch 110 and control switches 112. The control signal determines whether the main switch 110 and the control switches 112 are opened or closed. By selectively opening or closing the main switch 110 of the control switches 112, the control signal determines whether the capacitances of the tuning capacitors 108 and 109 will be effectively added to the outputs OUT and OUTn of the VCO 102.

In some embodiments, the control switches 112 connect a terminal of either or both of the tuning capacitors 108 and 109 to either ground or a high supply voltage VDD. This connection determines, in part, whether or not the capacitances of the tuning capacitors 108 and 109 will be added to the output OUT and OUTn.

In some embodiments, a first terminal of the first tuning capacitor 108 is coupled to OUT. A second terminal of the tuning capacitor 108 is coupled to the main switch 110. A first terminal of the second tuning capacitor 109 is coupled to OUTn. A second terminal of the second tuning capacitor 109 is coupled to the main switch 110. The main switch 110 determines whether the second terminals of the first and second tuning capacitors 108 and 109 are coupled together. This determines, in part, whether or not the capacitances of the tuning capacitors 108 and 109 are added to OUT and OUTn.

In one example, the capacitances of the tuning capacitors 108 and 109 are added to OUT and OUTn when the second terminals of the tuning capacitors 108 and 109 are electrically coupled together by turning on or closing the main switch 110 and by coupling the second terminals of the tuning capacitors 108 and 109 to ground via operation of the control switches 112. This results in the capacitances of the tuning capacitors 108 and 109 being effectively added to the OUT and OUTn, thereby increasing the overall capacitance associated with OUT and OUTn in reducing the frequency of the oscillating signal and the complementary oscillating signal. As used herein, effectively adding the capacitances can include adding half of the total capacitance of the first tuning capacitor 108 and the second tuning capacitor 109 to the outputs OUT and OUTn.

The quality factor associated with the training bank 106 depends, in part, on the on-resistance Ron of the main switch 110. The on-resistance Ron corresponds to the resistance of the main switch 110 when the main switch 110 is turned on or closed. A higher on-resistance Ron results in a worse quality factor. Incidentally, in some embodiments the on-resistance of the control switches 112 does not heavily affect the quality factor associated with the training bank 106. If the quality factor of the tuning bank 106 is poor, then the qualities of the oscillating signal and the complementary oscillating signal may also be poor. This can include high damping, high noise, and high variability in the frequency of the oscillating signal and the complementary oscillating signal. One way to reduce the on-resistance of the main switch 110 is to increase the size of the main switch 110. However increasing the size of the main switch 110 results in increasing the parasitic capacitance associated with the main switch 110. This increase in parasitic capacitance would limit the frequency range of the VCO. Because the VCO may have many identical tuning backs, any increase in parasitic capacitance could severely limit the frequency rage of the VCO. One method to reduce the on-resistance of the main switch 110 is to use a low voltage transistor as the main switch 110. Typically, a low voltage transistor has a thinner gate-oxide, a smaller safe operating voltage range, a smaller absolute maximum rating (AMR), a shorter minimum channel length and higher transconductance. However using a low voltage MOS transistor as the main switch 110 can also increase the risk that the main switch 110 will be damaged by higher voltage differences appearing across the terminals of the main switch 110. For example, if a low voltage transistor is used as the main switch 110 and a voltage difference greater than the supply voltage (or outside a safe operating region of the low voltage transistor) appears between a control terminal of the main switch 110 and either of the terminals connected to the tuning capacitors 108 and 109, then the main switch 110 may be damaged or destroyed. This would result in the tuning bank 106 no longer being operable.

The tuning bank 106 includes a level shifter 114. The level shifter 114 helps ensure that the voltage difference greater than a supply voltage does not appear across the terminals of the main switch 110. This enables the main switch 110 to have a relatively small size without the risk of being damaged. The small size of the main switch 110 results in a small on-resistance Ron and a high quality factor. The high quality factor of the tuning circuit 106 results in better tuning of the oscillating signal and the complementary oscillating signal.

The level shifter 114 receives the control signal 114 and generates a level shifted control signal. The level shifted control signal helps to ensure that dangerously high voltages do not appear across the terminals of the main switch 110 when the main switch one is off. In some embodiments, the level shifter 114 level shifts the low-voltage value of the control signal. If the control signal can have either a low value of ground or a high value of the high supply voltage VDD, then the level shifted control signal will have a low value that is between ground and VDD. The level shifted control signal will have a high value of VDD. Thus, when the control signal is low and the second terminals of the tuning capacitors 108 are supposed to receive VDD but instead receive a voltage higher than VDD, the low value of the level shifted control signal will not be ground but an intermediate voltage higher than ground and lower than VDD. Because the control terminal receives the intermediate voltage rather than ground, the voltage difference between the control terminal and the other terminals of the main switch 110 does not go higher than VDD.

In some embodiments, the intermediate voltage is halfway between ground and VDD. If the voltage of the second terminals becomes VDD*1.5 while the intermediate voltage VDD/2 is provided to the control terminal of the main switch 110, then the total voltage drop across the main switch 110 is VDD. Accordingly, even when high fluctuations occur at the second terminals of the tuning capacitors 108 and 109, the voltage difference between the terminals of the main switch one does not go higher than VDD because of the level shifted control signal provided to the main switch 110.

The level shifter 114 can provide other types of level shifted voltages to the main switch one, without departing from the scope of the present disclosure. For example, depending on the types of connections of the control switches 112 relative to the tuning capacitors 108 and 109 and the main switch 110, the level shifter 114 may be designed to shift both the high-voltage value and the low-voltage value upward, or to only shift the high-voltage value downward. Accordingly, the level shifter 114 can level shifted control signal in various ways without departing from the scope of the present disclosure.

Figure 2:
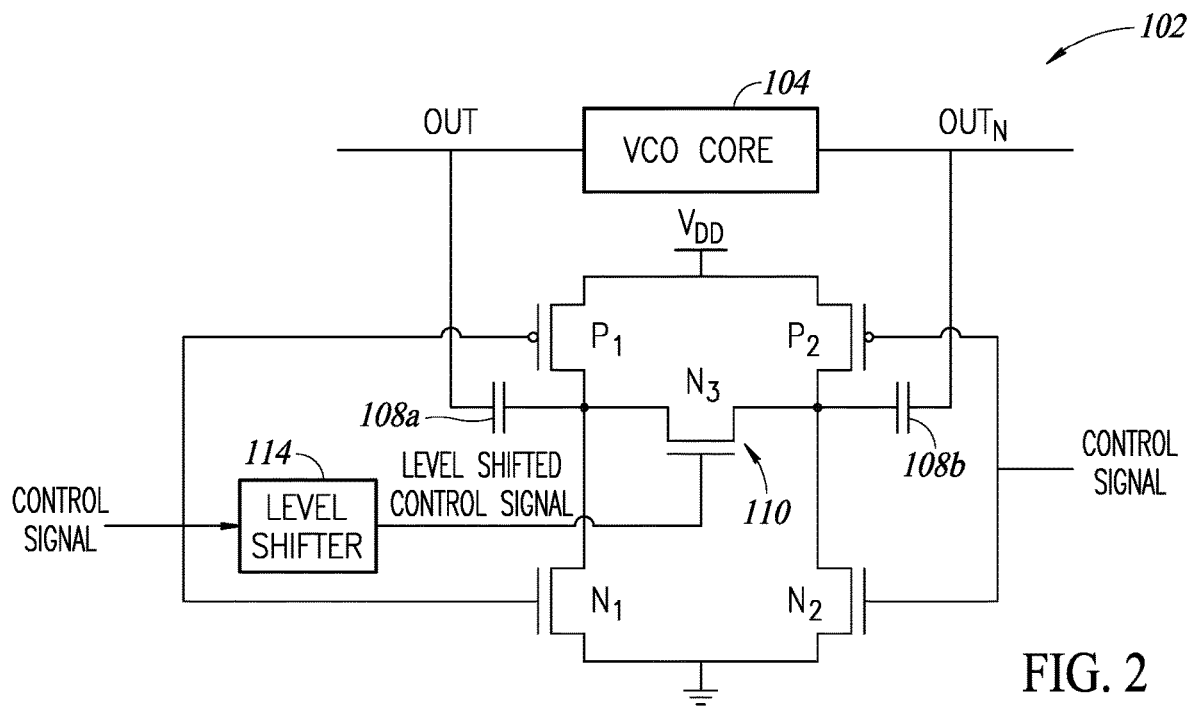
FIG. 2 is a schematic diagram of a VCO, in accordance with some embodiments.

FIG. 2 is a schematic diagram of a VCO 102, in accordance with some embodiments. The VCO 102 includes a VCO core 104 and a tuning bank 106. The VCO core 104 can be substantially similar to the VCO core 104 described in relation to FIG. 1. Accordingly, the VCO core 104 outputs an oscillating signal on the output OUT and outputs a complementary oscillating signal on the output OUTn. The tuning bank 106 can be selectively activated to adjust the frequency of the oscillating signal and the complementary oscillating signal.

The tuning bank 106 includes two PMOS control switches P1 and P2. The training bank 106 includes two NMOS control switches N1 and N2. The control switches P1, P2, N1, and N2 are one example of control switches 112 of FIG. 1. The tuning bank 106 includes a first tuning capacitor 108 and a second tuning capacitor 109. The first tuning capacitor 108 and the second tuning capacitor 109 are one example of first and second tuning capacitors 108 and 109 of FIG. 1.

The tuning bank 106 includes a main transistor N3. The main transistor N3 is one example of a main switch 110 described in relation to FIG. 1. The tuning bank 106 includes a level shifter 114.

The first tuning capacitor 108 has a first terminal coupled to the output terminal OUT and a second terminal coupled to the drain terminal of the transistor P1, the drain terminal of the transistor N3, and the drain terminal of the transistor N1. The second tuning capacitor 109 has a second terminal coupled to the output terminal OUTn, the drain terminal of the transistor P2, the source terminal of the main transistor N3, and the drain terminal of the transistor N2.

The transistor P1 has a source terminal connected to the high supply voltage VDD, a gate terminal that receives a control signal, and a drain terminal connected to a second terminal of the transistor 108, a drain terminal of the main transistor N3, and a drain terminal of the transistor N1. The transistor P2 has a source terminal connected to the high supply voltage VDD, a gate terminal that receives the control signal, and a drain terminal connected to a second terminal of the tuning capacitor 109, the source terminal of the main transistor N3, and the drain terminal of the transistor N2. The transistors P1 and P2 may be termed pull-up transistors because they can pull the second terminals of the tuning capacitors 108 and 109 up to the high supply voltage VDD.

The transistor N1 has a source terminal connected to ground, a gate terminal that receives the control signal, and a source terminal connected to the second terminal of the tuning capacitor 108, the drain terminal of the transistor P1, and the drain terminal of the main transistor N3. The transistor N2 has a source terminal coupled to ground, a gate terminal that receives the control signal, and a drain terminal coupled to the second terminal of the tuning capacitor 109, the drain terminal of the transistor P2, and the source terminal of the main transistor N3. The transistors N1 and N2 may be termed pull-down transistors because they can pull second terminals of the tuning capacitors 108 and 109 down to ground voltage.

The level shifter 114 has an input terminal that receives the control signal. The level shifter 114 generates, from the control signal, a level shifted control signal. The level shifter 114 has an output terminal that provides the level shifted control signal to the gate terminal of the main transistor N3.

The VCO core 104 is designed to output the oscillating signal with a selected frequency and a corresponding period. The oscillating signal may be a clock signal, or clock signal may be generated from the oscillating signal. The oscillating signal may have a frequency between 1 MHz and 5 GHz, though other frequencies are possible without departing from the scope of the present disclosure.

As described previously, in some cases the frequency of the oscillating signal may be different than desired due to temperature variations, process variations, or other circumstances. In this case, the tuning bank 106 can be selectively activated to effectively add the capacitances of the tuning capacitors 108 and 109 to the output terminals OUT and OUTn.

The control signal determines whether or not the tuning bank 106 is activated. If the value of the control signal is high, then the transistors P1 and P2 will be off. The transistors N1 and N2 will be on. Because the transistors N1 and N2 are on, the second terminals of the transistors 108 and 109 receives ground voltage. The main transistor N3 will also be on. Because the main transistor N3 is on, the second terminals of the tuning capacitors 108 and 109 are electrically coupled together. In this state, the tuning bank 106 adjusts the frequency of the oscillating signal and a complementary oscillating signal because the capacitances of the tuning capacitors 108 and 109 are effectively added to the capacitances associated with the outputs OUT and OUTn. More particularly, the total capacitance added to OUT and OUTn is half the capacitance of either the tuning capacitor 108 and the tuning capacitor 109, in an example in which the capacitances of the first and second tuning capacitors 108 and 109 are approximately equal. In this example, the training bank 106 reduces the frequency of the oscillating signal.

The quality factor Qc associated with the tuning bank 106 when activated is given by the following relationship:

$$Q_C = \frac{2}{(2 * \pi * fosc * Cu * Ro_n)}$$

where fosc is the frequency of the oscillating signal, Cu is the capacitance of either of the tuning capacitors 108 and 109, and Ron is the on-resistance of the main transistor N3 when the main transistor N3 is turned on. Accordingly, the quality factor Qc is inversely proportional to the on-resistance Ron of the main transistor N3. The on-resistance Ron of the main transistor N3 is given by the following relationship:

where, μn is the electron mobility in the channel region of the main transistor N3, Cox is $$Ron = \frac{1}{\mu_n Cox \frac{W}{L}(V_{GS} - VTH)}$$

the capacitance between the gate terminal and the channel region of the main transistor N3, W is the width of the channel region of the main transistor N3, L is the length of the channel region of the main transistor N3, Vgs is the gate to source voltage of the main transistor N3, and Vth is the threshold voltage of the main transistor N3.

As can be seen from the relationship above, if the main transistor N3 has a shorter channel length L, then the on-resistance Ron will be lower. The shorter channel length L also results in a higher transconductance gm of the transistor Ron. However, as described previously, using a low voltage transistor 110 as the main switch also puts the main transistor N3 at higher risk of damage if voltage differences higher than the supply voltage VDD appear across its terminals.

The Q-factor of the tuning bank 106 is not heavily affected by the on-resistance of the control transistors P1, P2, N1, and N2. Because the transistors P1, P2, N1 and N2 do not significantly impact the Q-factor, these devices can be implemented as high voltage transistors. This may mean that P1, P2, N1, and N2 have thicker gate-oxides, larger safe operating voltage ranges, and larger absolute maximum ratings (AMR) than low voltage transistors. Special precautions may not need to be taken to protect the transistors P1, P2, N1, and N2. In one example, the channel lengths of the transistors P1, P2, N1, and N2 are at least five times greater than the channel length of the transistor N3.

Returning to an example in which the control signal is high, the level shifted control signal has a same value, VDD, as the control signal. Accordingly, the gate terminal of the main transistor N3 receives VDD. Vgs of the main transistor N3 is VDD. In an example in which the control signal is the low logic level, ground, the pull-down transistors N1 and N2 are off. The pull-up transistors P1 and P2 are on. This couples the second terminals of the tuning capacitors 108 and 109 to VDD.

However, due to the week pull up strength of P1 and P2, the oscillations at OUT and OUTn, and variations in the supply voltage VDD, it is possible that voltages as high as 1.5 VDD may appear at the second terminals of the tuning capacitors 108 and 109, as well as at the source and drain terminals of the main transistor N3. If the gate terminal of the main transistor N3 receives ground voltage during these high fluctuations, it is possible that the main transistor N3 will be damaged because the magnitude of Vgs (0-1.5*VDD) is higher than the high supply voltage VDD.

Accordingly, the level shifter 114 level shifts the low logic value of the control signal to an intermediate voltage between ground and VDD. In other words, the level shifted voltage has a high logic value VDD and a low logic value between VDD and ground. In one example, the low logic value of the level shifted control signal, or the intermediate voltage, is halfway between ground and VDD. Accordingly a VDD is 1 V, then the intermediate voltage is 0.5 V. Because the intermediate voltage is halfway between ground and VDD, the magnitude of Vgs of the main transistor N3 is Vgs=VDD/2−1.5VDD=−VDD.

Thus, the magnitude of the voltage difference between the terminals of N3 when N3 is off is equal to VDD. The level shifted control signal therefore protects the main transistor N3 from damage while allowing the main transistor N3 to be implemented as a low voltage transistor, thereby ensuring a low on-resistance Ron and a high Q-factor.

Figure 3:
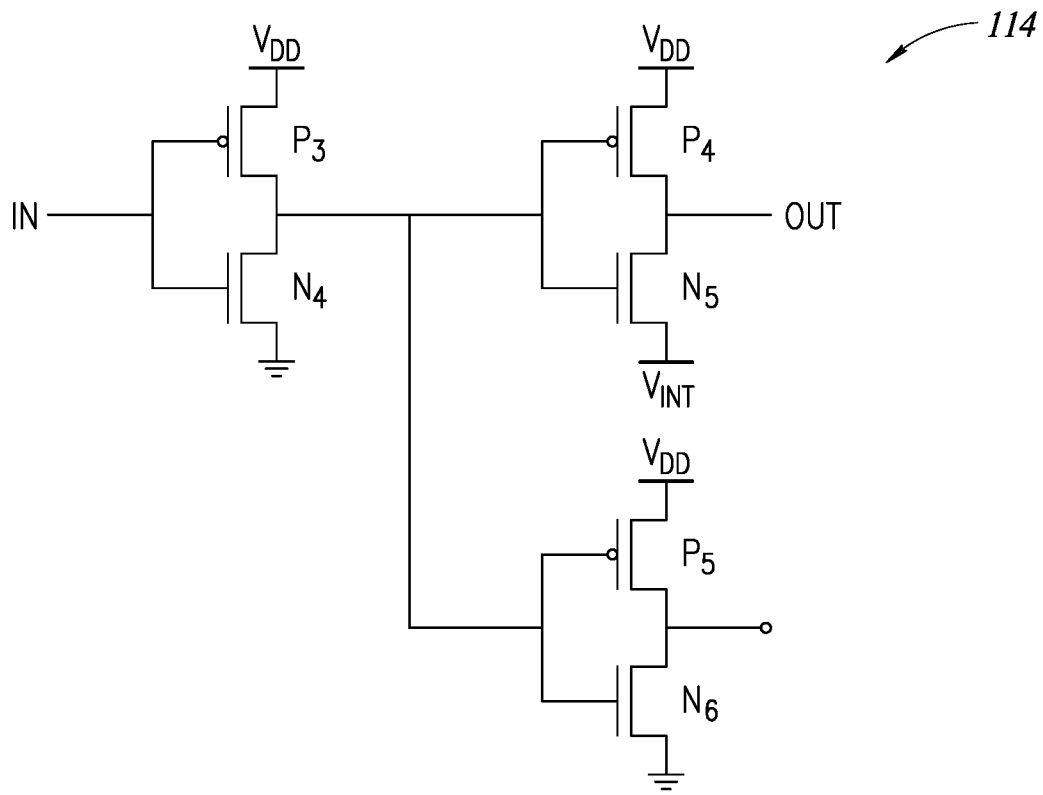
FIG. 3 is a schematic diagram of a level shifter of a VCO, in accordance with some embodiments.

FIG. 3 is a schematic diagram of a level shifter 114, according to one embodiment. The level shifter 114 of FIG. 3 is one example of a level shifter 114 of FIGS. 1 and 2. The level shifter 114 includes PMOS transistors P3, P4, and P5. The level shifter 114 includes NMOS transistors N4, N5, and N6. The level shifter 114 receives the high supply voltage VDD, the low supply voltage ground, and an intermediate voltage Vint.

The transistors P3 and N4 are coupled together as an inverter 120. The gate terminals of the transistors P3 and N4 are coupled together and are coupled to the input of the level shifter 114. The gate terminals of the transistors P3 and N4 receives the control signal. The source terminal of the transistor P3 is coupled to the high supply voltage VDD. The source terminal of the transistor N4 is coupled to ground. The drain terminals of the transistors P3 and N4 are coupled together and correspond to the output of the inverter 120.

The transistors P4 and N5 are coupled together as an inverter 122. The gate terminals of the transistors P4 and N5 are coupled together and are coupled to the output of the inverter 120. The source terminal of the transistor P4 is coupled to the high supply voltage VDD. The source terminal of the transistor N5 is coupled to intermediate voltage Vint. The drain terminals of the transistors P4 and N5 are coupled together and correspond to the output of the inverter 122 and the output of the level shifter 114.

When the control signal is at the high logic value VDD, the input of the inverter 120 receives the high logic value VDD. The inverter 120 outputs the low logic value ground. The inverter 122 receives the low logic value ground and outputs the high logic value VDD. Accordingly, when the control signal is at the high logic value VDD, the level shifted control signal is also at the high logic value VDD.

When the control signal is at the low logic value ground, the input of the inverter 120 receives the low logic value ground. The inverter 120 outputs the high logic value VDD. The inverter 122 receives the high logic value VDD and outputs the intermediate voltage Vint. This is because the source of the transistor N5 is coupled to the intermediate voltage Vint. Thus, when the inverter 122 receives VDD at the gate terminals of P4 and N5, P4 is off and N5 is on. Because N5 is on, the output of the inverter 114 is coupled to Vint. Accordingly, when the control signals at the low logic value ground, the level shifted control signal is at the intermediate voltage Vint.

The level shifter 114 may also include the third inverter 124 having an input coupled to the output of the inverter 120 and to the input of the inverter 122. The third inverter 124 includes the transistors P5 and N6 coupled together as an inverter. The source terminal of the transistor P5 receives VDD. The source terminal of the transistor N6 receives ground. Accordingly, the inverter 124 can output VDD or ground. It may be desirable to include such an inverter in cases where the level shifter 114 has a desire to output both the level shifted control signal and the standard control signal.

Figure 4:
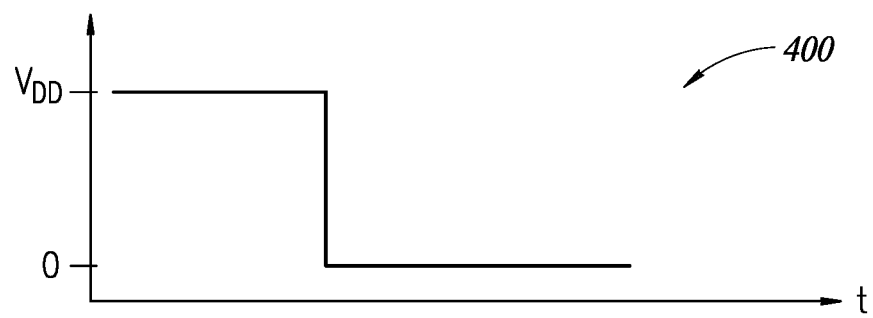
FIG. 4 is a graph illustrating control signals associated with a VCO, in accordance with some embodiments.
Figure 4:
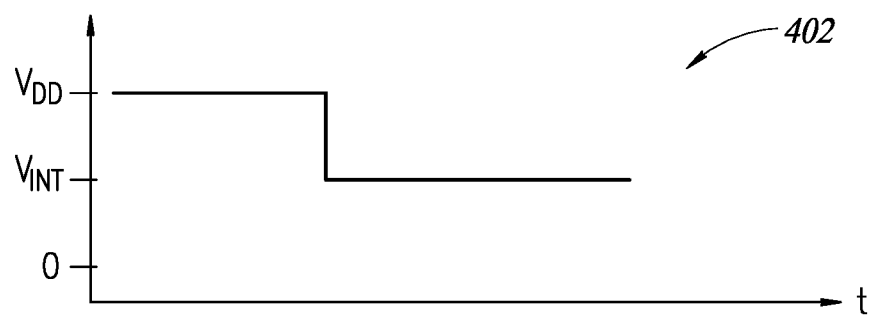

FIG. 4 is a graph 400 illustrating the control signal and a graph 402 illustrating the level shifted control signal, in accordance with some embodiments. When the control signal is at the high logic value VDD, the level shifted control signal is also at the high logic value VDD. When the control signal transitions to the low logic value ground, the level shifted control signal transitions to the intermediate voltage Vint. In the example of FIG. 4, the intermediate voltage is halfway between ground and VDD, though the intermediate voltage can have other values between ground and VDD without departing from the scope of the present disclosure.

Figure 5:
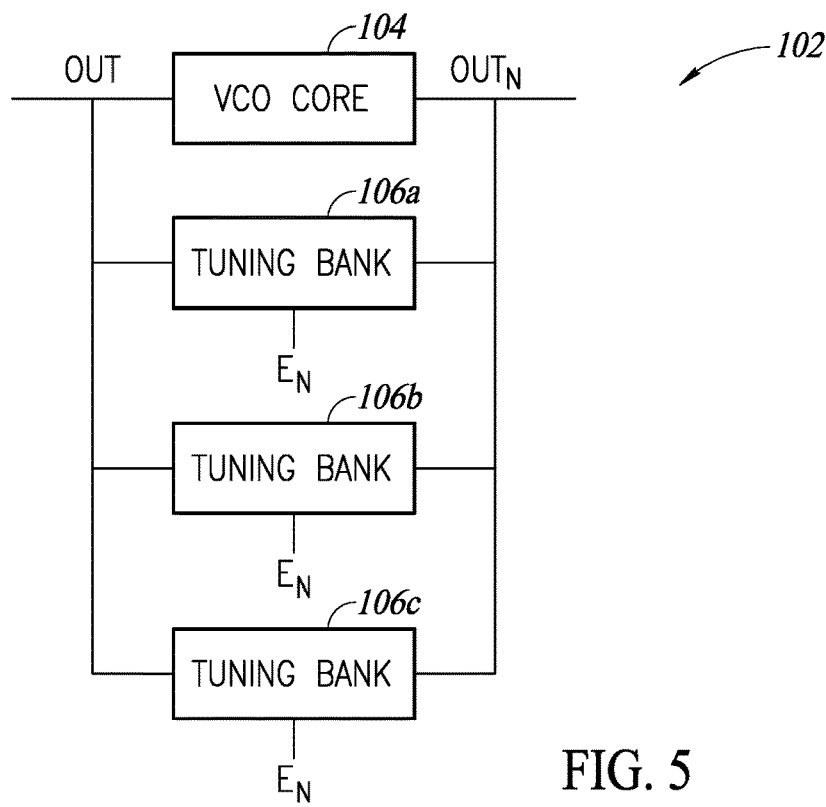
FIG. 5 is a block diagram of a VCO, in accordance with some embodiments.

FIG. 5 is a block diagram of a VCO 102, in accordance with some embodiments. The VCO 102 includes a VCO core 104. The VCO core 104 may operate substantially similarly to the VCO cores 104 described in relation to FIG. 1 or 2. The VCO 102 includes a plurality of tuning banks 106a, 106b, and 106c. Each of the tuning banks 106a, 106b, and 106c may be substantially similar to the tuning banks 106 of FIG. 1 or 2.

In FIG. 5, the tuning banks 106a-c each receive and enable signal En. The enable signal En corresponds to the control signal described in relation to FIGS. 1-4. Each of the tuning banks 106a-c can be selectively enabled or disabled separately from each other in order to adjust the frequency of the oscillating signal of the VCO core 104 by electrically coupling or decoupling the tuning capacitors of the tuning banks 106a-c to the outputs OUT and OUTn.

In some embodiments, the tuning capacitors 108 and 109 of the tuning banks 106a-c may have different values. This enables the tuning banks 106a-c to adjust the frequency of the oscillating signal by different values.

In some embodiments, one or more of the tuning banks 106a-c may be initially enabled by default. In this case, the intended frequency of the VCO one may be based on the VCO core 104 adjusted by one or more tuning banks. In this way, if the frequency needs to be increased, one or more the initially enabled tuning banks may be disabled or disconnected in order to increase the frequency by decoupling the capacitances of the tuning capacitors of the initially enabled tuning banks.

Figure 6:
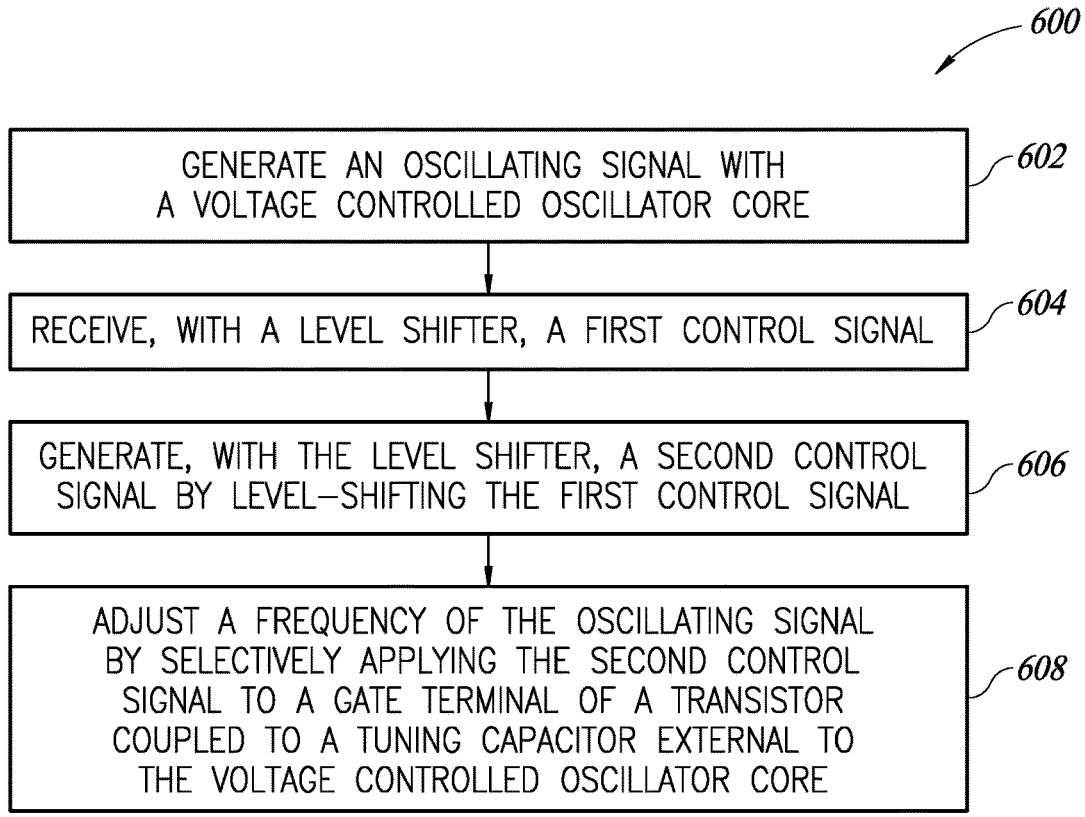
FIG. 6 is a flow diagram of a method for operating a VCO, in accordance with some embodiments.

FIG. 6 is a flow diagram of a method 600 for operating a VCO, in accordance with some embodiments. At 602, the method 600 includes generating an oscillating signal with a VCO core. At 604, the method 600 includes receiving, with a level shifter, a first control signal. At 606, the method 600 includes generating, with the level shifter, a second control signal by level-shifting the first control signal. At 608, the method 600 includes adjusting a frequency of the oscillating signal by selectively applying the second control signal to a gate terminal of a transistor coupled to a tuning capacitor external to the VCO core.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit, comprising:
   a voltage controlled oscillator, including:
     a voltage controlled oscillator core having a first output and a second output;
     a first capacitor coupled to the first output;
     a second capacitor coupled to the second output;
     a main transistor coupled between the first capacitor and the second capacitor; and
     a level shifter coupled to a gate terminal of the main transistor;
     a pull-up transistor coupled between the first capacitor and a high supply voltage; and
     a pull-down transistor coupled between the first capacitor and ground, wherein the pull-up transistor and pull-down transistor receive a first control signal having a first state and a second state.

2. The integrated circuit of claim 1, wherein the level shifter outputs to the gate terminal of the first transistor a second control signal having a first state and a second state, wherein a difference between the first state and the second state of the second control signal is smaller than a difference between the first state and the second state of the first control signal.

3. The integrated circuit of claim 2, wherein:
   the first state of the first control signal is ground;
   the second state of the second control signal is the high supply voltage;
   the first state of the second control signal is between ground and the high supply voltage; and
   the second state of the second control signal is the high supply voltage.

4. The integrated circuit of claim 2, wherein the pull-up transistor and the pull-down transistor are both larger than the main transistor.

5. The integrated circuit of claim 2, wherein the pull-up transistor and the pull-down transistor each have a higher maximum voltage rating than does the main transistor.

6. The integrated circuit of claim 1, wherein the level shifter receives ground and the high supply voltage and selectively outputs the high supply voltage and a voltage higher than ground.

7. The integrated circuit of claim 6, wherein the level shifter outputs a control signal to the main transistor to selectively adjust a frequency of an oscillating signal from the voltage controlled oscillator core.

8. The integrated circuit of claim 1, wherein the first output provides a first oscillating signal, wherein the second output provides a second oscillating signal that is a logical compliment of the oscillating signal.

9. A method, comprising:
   generating an oscillating signal with a voltage controlled oscillator core;
   receiving, with a level shifter, a first control signal;
   generating, with the level shifter, a second control signal by level-shifting the first control signal;
   applying the first control signal to a pull-up transistor coupled between the tuning capacitor and a high supply voltage;
   applying the first control signal to a pull-down transistor coupled between the tuning capacitor and ground; and
   adjusting a frequency of the oscillating signal by selectively applying the second control signal to a gate terminal of a main transistor coupled to a tuning capacitor external to the voltage controlled oscillator core.

10. The method of claim 9, wherein the main transistor is coupled between the first tuning capacitor and a second tuning capacitor.

11. The method of claim 10, wherein adjusting the frequency of the oscillating signal includes electrically coupling the first tuning capacitor to the second tuning capacitor by applying the second control signal to the gate terminal of the main transistor.

12. The method of claim 11, wherein the first control signal can switch between high supply voltage and ground.

13. The method of claim 12, wherein the second control signal can switch between the high supply voltage and a voltage greater than ground and less than the high supply voltage.

14. An integrated circuit, comprising:
   a voltage controlled oscillator core;
   a first tuning capacitor having a first terminal coupled to a first output of the voltage controlled oscillator core;
   a main transistor having a first conduction terminal coupled to the first terminal of the first tuning capacitor;
   a second tuning capacitor having:
     a first terminal coupled to a second output of the voltage controlled oscillator core; and
     a second terminal coupled to a second conduction terminal of the main transistor
   a level shifter coupled to a gate terminal of the main transistor;
   a first pull-up transistor coupled between the second terminal of the first tuning capacitor and a high supply voltage;
   a second pull-up transistor coupled between the second terminal of the first tuning capacitor and the high supply voltage;
   a first pull-down transistor coupled between the second terminal of the first tuning capacitor and ground; and
   a second pull-down transistor coupled between the second terminal of the first tuning capacitor and ground.

15. The integrated circuit of claim 14, wherein gate terminals of the first pull-up transistor, the second pull-up transistor, the first pull-down transistor, and the second pull-down transistor all receive a first control signal that switches between the high supply voltage and ground.

16. The integrated circuit of claim 15, wherein the level shifter receives the first control signal, generates from the first control signal a second control signal that switches between the high supply voltage and a voltage between the high supply voltage and ground.

* * * * *